(12) United States Patent  (10) Patent No.: US 7,804,222 B2
Hood  (45) Date of Patent: Sep. 28, 2010

(54) METHOD OF OPTIMIZING DRIVE FREQUENCY FOR PIEZO FAN DEVICE

(75) Inventor: Charles D. Hood, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 1245 days.

(21) Appl. No.: 11/366,644

(22) Filed: Mar. 2, 2006

(65) Prior Publication Data

US 2007/0205694 A1  Sep. 6, 2007

(51) Int. Cl.
*H01L 41/09* (2006.01)
(52) U.S. Cl. .................. 310/316.01; 310/317
(58) Field of Classification Search ............ 310/316.01, 310/317
See application file for complete search history.

(56) References Cited

U.S. PATENT DOCUMENTS 4,739,211 A * 4/1988 Strachan .................... 310/321

6,713,942 B2 * 3/2004 Raman et al. .......... 310/316.01
2009/0026881 A1 * 1/2009 Erturk et al. ................ 310/311

FOREIGN PATENT DOCUMENTS

GB  2321105 A  *  7/1998
JP  64-57000 A  *  3/1989

* cited by examiner

*Primary Examiner*—Thomas M Dougherty
(74) *Attorney, Agent, or Firm*—Haynes and Boone, LLP

(57) ABSTRACT

For tuning a piezo electric fan, a controller measures a natural frequency of the piezo electric fan by applying a stress and measuring a response to the stress. A frequency of an alternating current (AC) input signal is adjusted by the controller to substantially match the natural frequency. The adjusted AC input having the natural frequency is provided to the piezo electric fan for improved efficiency.

18 Claims, 4 Drawing Sheets

METHOD OF OPTIMIZING DRIVE FREQUENCY FOR PIEZO FAN DEVICE

BACKGROUND

The present disclosure relates to heat removal systems, and more particularly to improved operation of a piezo fan device used for heat removal in an information handling system ('IHS').

As the value and use of information continues to increase, individuals and businesses seek additional ways to acquire, process and store information. One option available to users is information handling systems. The information handling system ('IHS') generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, entertainment, and/or global communications. In addition, information handling systems may include a variety of hardware and software components that may be configured to process, store, and communicate information and may include one or more computer systems, data storage systems, and networking systems.

The phenomenon of piezo electricity, which is well known, generally refers to the generation of surface charges in response to stresses applied to certain types of crystals. In a piezo electric device, a voltage applied across its pair of terminals induces stress in the device, thereby causing displacement and/or bending. Similarly, a mechanical stress applied to a crystal or sensor in the device results in generating an electric charge across the pair of terminals. A piezo electric fan is a well known device that is based on piezo electricity. Presently, many varieties and sizes of the piezo electric fan are commercially available and may be used in a heat removal system.

FIG. 1A illustrates a view in perspective of a simple cantilever style piezo electric fan 100, according to prior art. FIG. 1B illustrate various views of the piezo electric fan shown in FIG. 1A, according to prior art. Referring to FIGS. 1A and 1B, the piezo electric 100 includes a flexible thin blade 110 typically made of mylar or plastic material. The blade 110 is affixed to a portion of piezo ceramic crystal assembly 120. The remaining portion of the piezo ceramic crystal assembly 120 is affixed to a base 130. In an exemplary, non-depicted embodiment, the base 130 may be removably clamped with a clamping structure. The piezo electric fan 100 includes a pair of terminals 140 for providing coupling to an electrical input or output. When an electrical signal such as an alternating current (AC) signal is applied between the terminals 140, the AC signal causes the piezo ceramic crystal assembly 120 to bend/elongate, thereby causing the blade 110 to swing between a first position 112 and a second position 114. The swinging or rapid flapping motion of the blade 110 (like a hummingbird) generates an airflow, which may be used for heat removal.

Presently, the performance and efficiency of the piezo electric fan 100 may vary depending on various factors such as physical characteristics of the blade (e.g., blade length, blade weight), clamping technique, characteristics of the electrical signal such as frequency and amplitude, variations in the fan manufacturing process and similar others. For example, a piezo electric fan 100 designed to remove heat and fit into specific dimensions of a hand-held IHS system, may be energy inefficient and may provide a reduced airflow volume when used with a standard 120 VAC, 60 hertz and/or 220 VAC, 50 hertz input signal.

Therefore, a need exists to improve the performance and the efficiency of the piezo electric fan. More specifically, a need exists to develop tools and techniques that are adaptable for optimizing the performance of the piezo electric fans having varying dimensions and characteristics. Accordingly, it would be desirable to provide for selectively tuning the performance of the piezo electric fan included in an IHS, absent the disadvantages discussed above.

SUMMARY

The foregoing need is addressed by the teachings of the present disclosure, which relates to improving efficiency of a piezo electric fan used for heat removal. According to one embodiment, for tuning a piezo electric fan, a controller measures a natural frequency of the piezo electric fan by applying a stress and measuring a response to the stress. A frequency of an alternating current (AC) input signal is adjusted by the controller to substantially match the natural frequency. The adjusted AC input having the natural frequency is provided to the piezo electric fan for improved efficiency.

In one embodiment, a controller for controlling a piezo electric fan includes a resonant frequency circuit and a control logic. The resonant frequency circuit measures a natural frequency of the piezo electric fan in response to a stress applied to the piezo electric fan. The control logic circuit adjusts a frequency of an alternating current (AC) input signal to substantially match the natural frequency. The adjusted AC input having the natural frequency is provided to the piezo electric fan for an improved efficiency.

Several advantages are achieved according to the illustrative embodiments presented herein. The embodiments advantageously provide an improved technique for controlling a piezo electric fan. The improved method and system advantageously optimize efficiency of the piezo electric fan by generating maximum volume of air displaced per unit of power received when operating substantially close to the natural frequency. Thus, portable IHS devices equipped with the piezo electric fan having the improved efficiency may generate less noise while operating for longer time without having to be re-charged.

DETAILED DESCRIPTION

Figure 1:
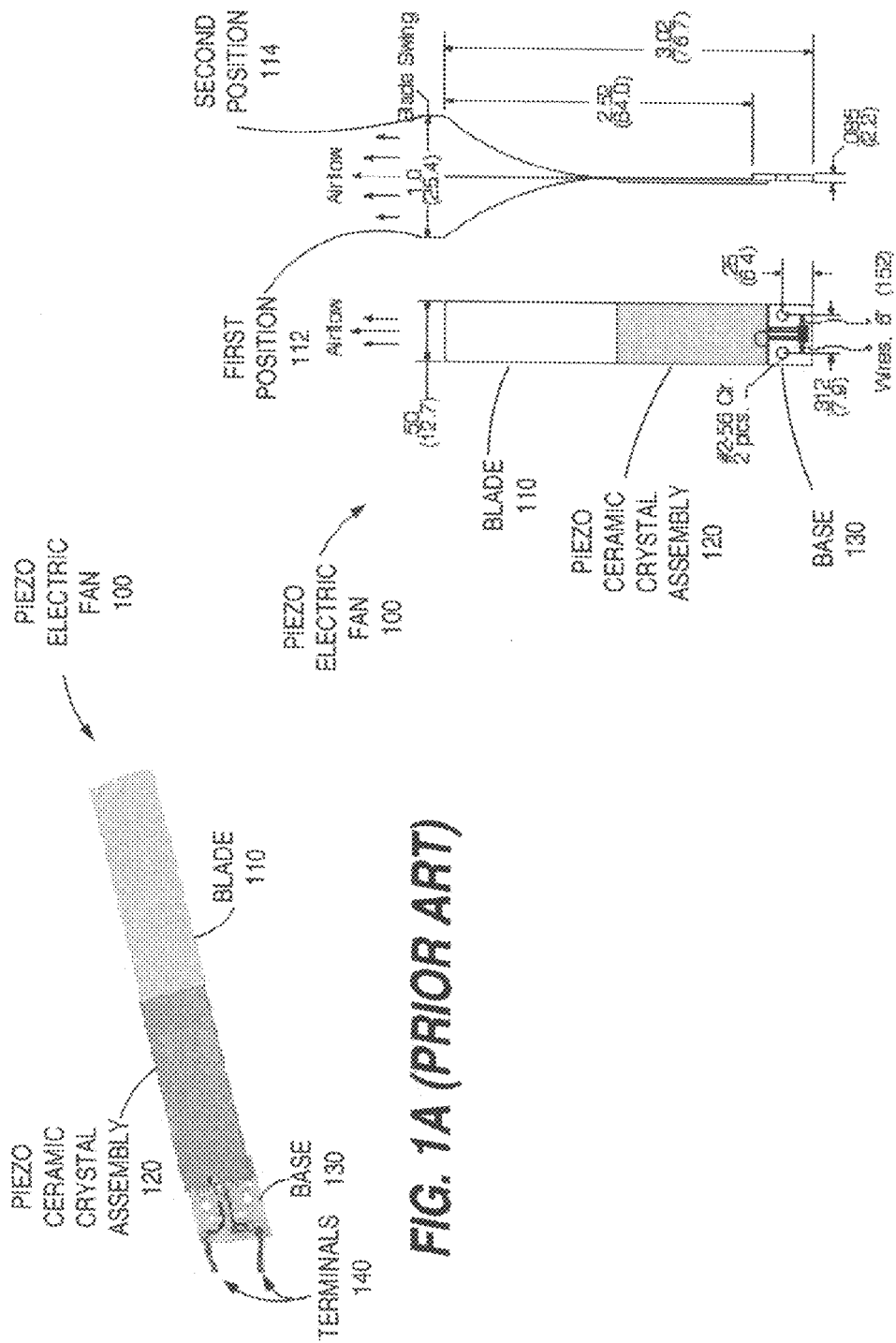
FIG. 1A illustrates a view in perspective of a simple cantilever style piezo electric fan, described herein above, according to prior art.
FIG. 1B illustrate various views of the piezo electric fan shown in FIG. 1A, described herein above, according to prior art.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices, boards, cards, modules, blocks, and/or components described herein may be implemented as hardware (including discrete components, integrated circuits and systems-on-a-chip 'SOC'), firmware (including application specific integrated circuits and programmable chips) and/or software or a combination thereof, depending on the application requirements. Similarly, the functionality of various mechanical elements, members, and/or components for forming modules, sub-assemblies and assemblies assembled in accordance with a structure for an apparatus may be implemented using various materials and coupling techniques, depending on the application requirements.

As described earlier, a piezo electric fan may be available in different dimensions and airflow volume displacement ratings. A piezo electric fan designed to remove heat and fit into specific dimensions of a hand-held IHS system, may be energy inefficient and may provide a reduced airflow volume when used with a standard 120 VAC, 60 hertz and/or 220 VAC, 50 hertz power input signal. Thus, a need exists to develop tools and techniques that are adaptable for optimizing the performance of the piezo electric fans having varying dimensions and characteristics. According to one embodiment, for tuning a piezo electric fan, a controller measures a natural frequency of the piezo electric fan by applying a stress and measuring a response to the stress. A frequency of an alternating current (AC) input signal is adjusted by the controller to substantially match the natural frequency. The adjusted AC input having the natural frequency is provided to the piezo electric fan for improved efficiency.

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, the IHS may be a personal computer, including notebook computers, personal digital assistants, cellular phones, gaming consoles, a network storage device, or any other suitable device and may vary in size, shape, performance, functionality, and price. The information handling system may include random access memory (RAM), one or more processing resources such as central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to receive/transmit communications between the various hardware components.

Figure 2:
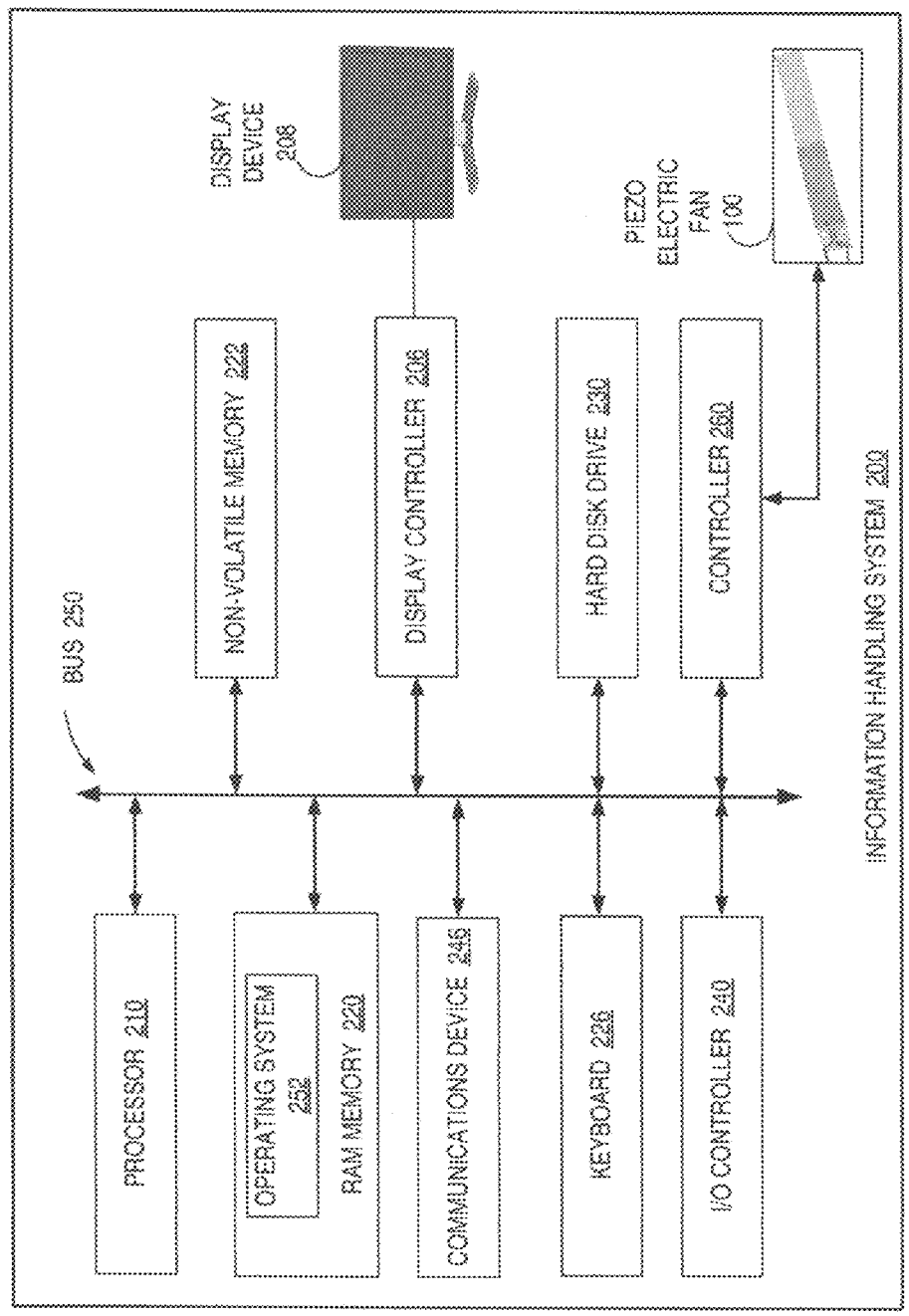
FIG. 2 illustrates a block diagram of an information handling system having a piezo electric fan for cooling, according to an embodiment.

FIG. 2 illustrates a block diagram of an information handling system 200 having a piezo electric fan for cooling, according to an embodiment. The information handling system 200 includes a processor 210, a system random access memory (RAM) 220 (also referred to as main memory), a non-volatile memory (NVM) 222 memory, a display controller 206 coupled to a display device 208, a keyboard 226 and an I/O controller 240 for controlling various other input/output devices. For example, the I/O controller 240 may include a keyboard controller, a cursor device controller and/or the serial I/O controller. In an exemplary, non-depicted embodiment, a printed circuit board such as a motherboard may include one or more electronic components such as the processor 210 and the RAM 220 memory. It should be understood that the term "information handling system" is intended to encompass any device having a processor that executes instructions from a memory medium.

The IHS 200 is shown to include a hard disk drive 230 connected to the processor 210, although some embodiments may not include the hard disk drive 230. In a particular embodiment, the IHS 200 may include additional hard disks. The processor 210 communicates with the system components via a bus 250, which includes data, address and control lines. In one embodiment, the IHS 200 may include multiple instances of the bus 250. In an exemplary, non-depicted embodiment, not all devices shown may be directly coupled to the bus 250. The multiple instances of the bus 250 may be in compliance with one or more proprietary standards and/or one or more industry standards such as PCI, PCIe, ISA, USB, SMBus, and similar others. A communications device 246, such as a network interface card and/or a radio device, may be connected to the bus 250 to enable wired and/or wireless information exchange between the IHS 200 and other devices (not shown).

In a particular embodiment, a controller 260 controls the operation of the piezo electric fan 100 used for cooling the IHS 200. Additional detail of the controller 260 is described with reference to FIG. 3.

The processor 210 is operable to execute the computing instructions and/or operations of the IHS 200. The memory medium, e.g., RAM 220, preferably stores instructions (also known as a "software program") for implementing various embodiments of a method in accordance with the present disclosure. An operating system (OS) 252 of the IHS 200 is a type of software program that controls execution of other software programs, referred to as application software programs. In various embodiments the instructions and/or software programs may be implemented in various ways, including procedure-based techniques, component-based techniques, and/or object-oriented techniques, among others. Software may also be implemented using C, XML, C++ objects, Java and Microsoft's .NET technology.

Figure 3:
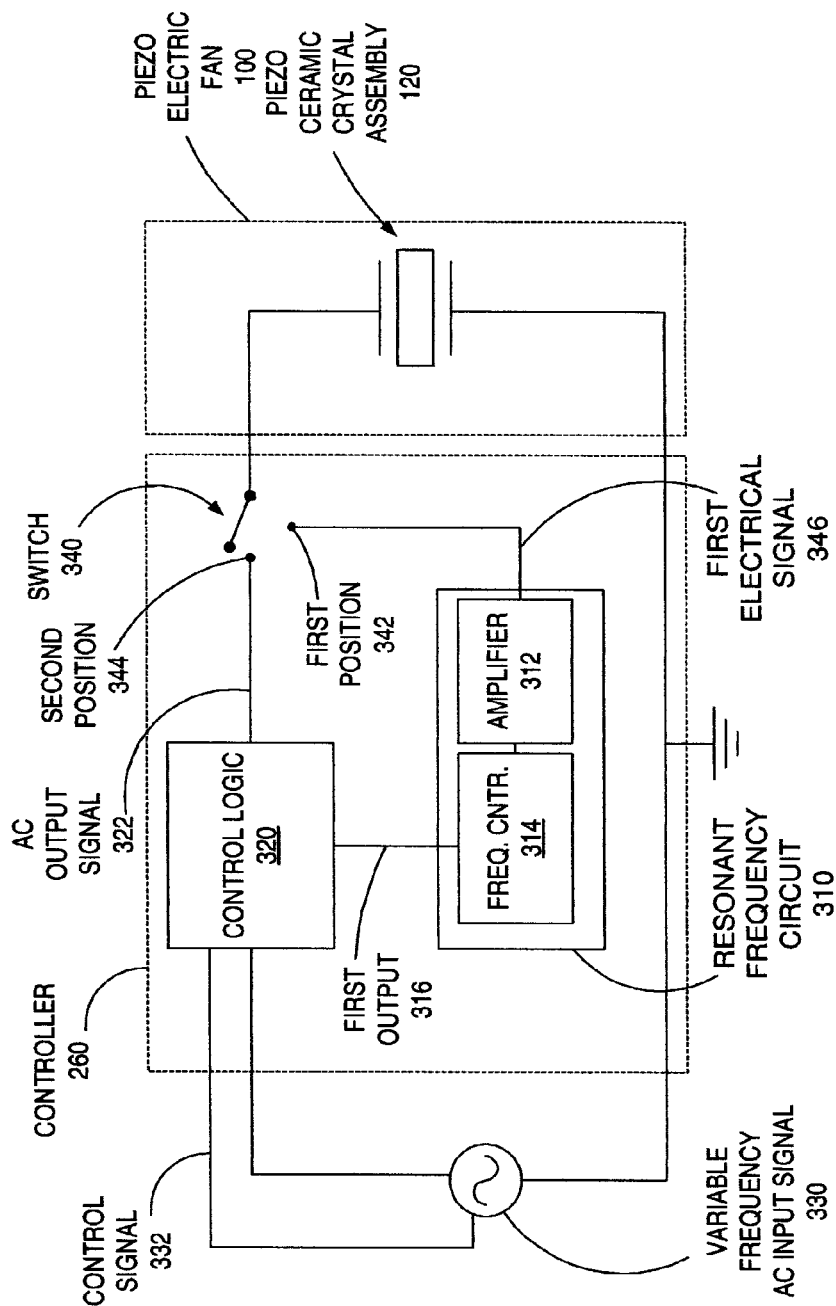
FIG. 3 illustrates a block diagram of a controller described with referenced to FIG. 2, according to an embodiment.

FIG. 3 illustrates a block diagram of the controller 260 for controlling the piezo electric fan 100 described with referenced to FIG. 2, according to an embodiment. In the depicted embodiment, the controller 260 includes a resonant frequency circuit 310 for measuring a natural frequency of the piezo electric fan 100 and a control logic 320 for tuning the operation of the piezo electric fan 100 for optimized performance and efficiency.

An alternating current (AC) input signal 330 provides power to the controller 260, the piezo electric fan 100 and one or more components of the IHS 200 system (not shown). In the depicted embodiment, the control logic 320 receives the AC input signal 330. In a particular embodiment, the AC input signal 330 has a variable frequency, which may be varied or adjusted by the controller 260 from a predefined minimum to a predefined maximum. The AC input signal 330 having the variable frequency may be generated by well known techniques such as by a voltage controlled oscillator. For example, in a particular embodiment, the frequency of the AC input signal 330 may be adjustable by a control signal 332 from a minimum frequency of about 10 hertz to a maximum frequency of about 100 hertz. Other frequency ranges are also contemplated.

In a particular embodiment, the controller 260 controls the operation of a switch 340 by placing it in one of two positions. When placed in a first position 342, the switch 340 electrically couples the piezo electric fan 100 to the resonant frequency circuit 310. When placed in a second position 344, the switch 340 electrically couples the piezo electric fan 100 to the control logic 320.

For measuring a natural frequency of the piezo electric fan 100, a stress is applied to the piezo electric fan 100 and a response of the piezo electric fan 100 to the stress is measured. The switch 340 is initially placed in the second position 344 and the stress applied to the piezo electric fan 100. The stress is in the form of the AC input signal 330 applied for a predefined period of time, where the AC input signal 330 has an initial (or default) frequency set by the control signal 332. In a particular embodiment, the initial frequency is configured to be approximately equal to an estimated value of the natural frequency the piezo electric fan 100. For example, an estimated natural frequency may be determined as a function of the physical and mechanical characteristics of the piezo electric fan 100 such as length of the blade 110 (not shown), weight of the piezo ceramic crystal assembly 120 and the blade 110 and similar other factors. The predefined period of time may be configured to be approximately equal to one second. As described earlier, application of the stress causes the piezo ceramic crystal assembly 120 to bend/elongate, thereby causing the blade 110 to swing between the first position 112 and the second position 114.

At the end of the predefined period of time, the switch 340 is switched from the second position 344 to the first position 342, thereby removing the source of the stress. The piezo electric fan 100 continues the rapid flapping motion of the blade 110 exhibiting a traditional damped response as a function of time. The piezo ceramic crystal assembly 120, which includes the piezo electrical crystal or sensor, generates a first electrical signal 346, which is indicative of the decaying value of the stress. A waveform of the first electrical signal 346 is substantially similar to a periodic damped signal having a damping coefficient and the natural frequency. The first electrical signal 346 is received by the resonant frequency circuit 310 for measuring the natural frequency.

In the depicted embodiment, the resonant frequency circuit 310 includes an amplifier 312 to receive and amplify the first electrical signal 346 and a frequency counter 314 to measure a series of amplitude versus time values and generate a first output 316 indicative of the natural frequency. The first output 316 is provided to the control logic 320. In response to measuring the natural frequency and generating the first output 316, the switch 340 is switched from the first position 342 back to the second position 344.

In the depicted embodiment, the control logic 320 controls, adjusts and/or tunes the AC input signal 330 via the control signal 332 by adjusting the initial frequency to substantially match the natural frequency. The control logic 320 provides an AC output signal 322 to the piezo electric fan 100. Thus, the AC output signal 322 is substantially the same as the AC input signal 330 having a frequency that is substantially matched to the natural frequency of the piezo electric fan 100.

The piezo electric fan 100 may be described as being tuned or optimally controlled when the AC output signal 322 has the natural frequency. An oscillation of the blade 110 is greater at the natural frequency than compared to another frequency that is different than the natural frequency. Thus, an efficiency of the piezo electric fan 100 is greater when the piezo electric fan 110 operates at the natural frequency compared to another frequency that is different than the natural frequency. The efficiency may be measured as a ratio of a volume of air displaced per unit of power received.

Figure 4:
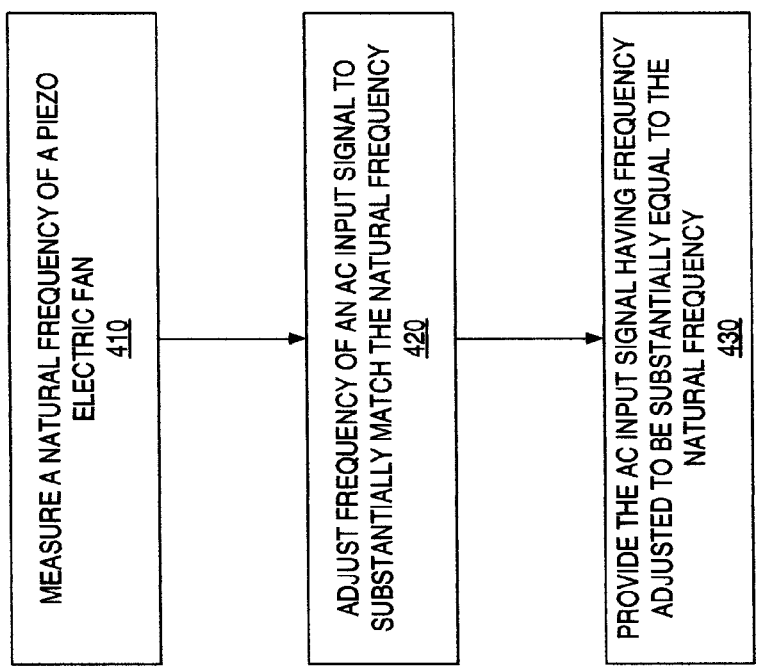
FIG. 4 is a flow chart illustrating a method for tuning a piezo electric fan, according to an embodiment.

FIG. 4 is a flow chart illustrating a method for tuning a piezo electric fan, according to an embodiment. In a particular embodiment, the piezo electric fan is the same as the piezo electric fan 100 described with reference to FIGS. 1A and 1B. In step 410, a natural frequency of the piezo electric fan is measured. In a particular embodiment, the measurement of the natural frequency is performed by stimulating the piezo electric fan and measuring a response to the stimulation. For example, a stress may be applied to the piezo electric fan causing the piezo electric fan to oscillate at the natural frequency. An electrical signal generated by the piezo electric sensor of the piezo electric fan may be received and measured to determine the natural frequency. In step 420, an alternating current (AC) input signal such as the AC input signal 330 is adjusted by the control signal 332 to substantially match the natural frequency. In step 430, the AC input signal 330 having the adjusted frequency to substantially match the natural frequency, e.g., the AC output signal 322, is provided to the piezo electric fan.

Various steps described above may be added, omitted, combined, altered, or performed in different orders. In a particular embodiment, the step 410 may be split into two steps including applying a stress to the piezo electric fan and receiving an electrical input indicative of the natural frequency.

The illustrative embodiments advantageously provide an improved technique for an improved operation of the piezo electric fan. The improved technique advantageously optimizes the efficiency of the piezo electric fan by generating maximum volume of air displaced per unit of power received when operating substantially close to the natural frequency. Thus, portable IHS devices equipped with the piezo electric fan having the improved efficiency may generate less noise while operating for longer time without having to be recharged.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A controller for controlling a piezo electric fan, the controller comprising:
   a resonant frequency circuit to measure a natural frequency of the piezo electric fan in response to a stress applied to the piezo electric fan;
   a control logic, wherein the control logic adjusts a frequency of an alternating current (AC) input signal to substantially match the natural frequency; and
   a switch operable to be selectively placed in one of a first position and a second position, wherein when placed in the first position the piezo electric fan is electrically coupled to the resonant frequency circuit and wherein when placed in the second position the piezo electric fan is electrically coupled to the control logic.

2. The controller of claim 1, wherein the resonant frequency circuit is electrically coupled to a piezo ceramic sensor of the piezo electric fan and wherein the piezo ceramic sensor generates a first electrical signal in response to the stress.

3. The controller of claim 2, wherein the resonant frequency circuit receives the first electrical signal and wherein a waveform of the first electrical signal is substantially similar to a periodic damped signal having a damping coefficient and the natural frequency.

4. The controller of claim 2, wherein the resonant frequency circuit includes:
   an amplifier to amplify the first electrical signal; and
   a frequency counter operable to receive the first electrical signal and provide a first output indicative of the natural frequency.

5. The controller of claim 1, wherein the natural frequency is a function of at least one physical property of the piezo electric fan and wherein one of the at least one physical property is a length of a blade of the piezo electric fan.

6. The controller of claim 5, wherein an oscillation of the blade is greater at the natural frequency than compared to another frequency that is different than the natural frequency.

7. The controller of claim 1, wherein an efficiency of the piezo electric fan is greater when the piezo electric fan operates at the natural frequency compared to another frequency that is different than the natural frequency.

8. The controller of claim 7, wherein the efficiency is measured as a ratio of a volume of air displaced per unit of power received.

9. The controller of claim 1, wherein the switch is initially placed in the second position to provide the stress, wherein the switch is switched from the second position to the first position to measure the natural frequency, wherein the switch is switched from first position back to the second position in response to measuring the natural frequency and wherein when placed in the second position for a second instance the piezo electric fan receives the AC input signal having the frequency that is substantially matched to the natural frequency.

10. The controller of claim 1, wherein the stress applied to the piezo electric fan switch includes exciting the piezo electric fan by providing the piezo electric fan with the AC input signal for a predefined period of time and wherein the AC input signal has an initial frequency.

11. The controller of claim 10, wherein the initial frequency is approximately equal to an estimated natural frequency and the predefined period of time is approximately equal to 1 second.

12. A method of tuning a piezo electric fan, the method comprising:
   measuring a natural frequency of the piezo electric fan, wherein the measuring includes:
     placing a switch in a first position such that a stress is applied to the piezo electric fan;
     after a period of time, removing the switch from the first position and placing the switch in a second position such that the stress is removed; and
     measuring an electrical output while the switch is in the second position;
   adjusting a frequency of an alternating current (AC) input signal to substantially match the natural frequency; and
   providing the alternating current (AC) input signal having the natural frequency to the piezo electric fan.

13. The method of claim 12, wherein the
   applying the stress to the piezo electric fan causes the piezo electric fan to oscillate at the natural frequency; and
   wherein the electrical output is indicative of the natural frequency.

14. The method of claim 12, wherein an efficiency of the piezo electric fan is greater when the piezo electric fan operates at the natural frequency compared to another frequency that is different than the natural frequency and wherein the efficiency is measured as a ratio of a volume of air displaced per unit of power received.

15. An information handling system (IHS) comprising:
   a printed circuit board having a plurality of electronic components;
   a piezo electric fan operable for removal of heat generated by the plurality of electronic components;
   a controller for controlling the piezo electric fan, wherein the controller, the plurality of electronic components, and the piezo electric fan are powered by an alternating current (AC) input signal having a variable frequency, wherein the controller includes:
     a resonant frequency circuit to measure a natural frequency of the piezo electric fan in response to a stress applied to the piezo electric fan; and
     a control logic, wherein the control logic adjusts a frequency of an alternating current (AC) input signal to substantially match the natural frequency; and
   a switch operable to be selectively placed in one of a first position and a second position, wherein when placed in the first position the piezo electric fan is electrically coupled to the resonant frequency circuit and wherein when placed in the second position the piezo electric fan is electrically coupled to the control logic.

16. The system of claim 15, wherein the natural frequency is a function of at least one physical property of the piezo electric fan and wherein one of the at least one physical property is a length of a blade of the piezo electric fan.

17. The system of claim 16, wherein an oscillation of the blade is greater at the natural frequency than compared to another frequency that is different than the natural frequency.

18. The system of claim 15, wherein an efficiency of the piezo electric fan is greater when the piezo electric fan operates at the natural frequency compared to another frequency that is different than the natural frequency and wherein the efficiency is measured as a ratio of a volume of air displaced per unit of power received.

* * * * *

UNITED STATES PATENT AND TRADEMARK OFFICE
CERTIFICATE OF CORRECTION

| | | |
|---|---|---|
| PATENT NO. | : 7,804,222 B2 | Page 1 of 1 |
| APPLICATION NO. | : 11/366644 | |
| DATED | : September 28, 2010 | |
| INVENTOR(S) | : Charles D. Hood | |

It is certified that error appears in the above-identified patent and that said Letters Patent is hereby corrected as shown below:

Column 1, line 37, delete "switch"

Column 8, line 7, "whereinthe" should be --wherein the--

Signed and Sealed this

Seventh Day of August, 2012

David J. Kappos
*Director of the United States Patent and Trademark Office*